(12) United States Patent
Hirao et al.

(10) Patent No.: US 11,233,011 B2
(45) Date of Patent: Jan. 25, 2022

(54) POWER SEMICONDUCTOR DEVICE

(71) Applicant: HITACHI AUTOMOTIVE SYSTEMS, LTD., Hitachinaka (JP)

(72) Inventors: Takashi Hirao, Tokyo (JP); Haruka Shimizu, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 16/982,406

(22) PCT Filed: Feb. 7, 2019

(86) PCT No.: PCT/JP2019/004342
§ 371 (c)(1),
(2) Date: Sep. 18, 2020

(87) PCT Pub. No.: WO2019/187679
PCT Pub. Date: Oct. 3, 2019

(65) Prior Publication Data
US 2021/0074647 A1    Mar. 11, 2021

(30) Foreign Application Priority Data
Mar. 26, 2018    (JP) .............................. JP2018-058160

(51) Int. Cl.
*H01L 23/538* (2006.01)
*H01L 23/495* (2006.01)
(Continued)

(52) U.S. Cl.
CPC .... *H01L 23/5386* (2013.01); *H01L 23/49537* (2013.01); *H01L 23/49575* (2013.01);
(Continued)

(58) Field of Classification Search
None
See application file for complete search history.

(56) References Cited

U.S. PATENT DOCUMENTS 8,847,384 B2 *  9/2014  Yoon ...................... H01L 23/562
                                                        257/712
2004/0104489 A1 *  6/2004  Larking .............. H01L 23/3114
                                                        257/787

(Continued)

FOREIGN PATENT DOCUMENTS

JP    2013-021107 A    1/2013
JP    2014-067897 A    4/2014

OTHER PUBLICATIONS

International Search Report with English translation and Written Opinion issued in corresponding application No. PCT/JP2019/004342 dated May 14, 2019.

*Primary Examiner* — Michelle Mandala
*Assistant Examiner* — Jordan M Klein
(74) *Attorney, Agent, or Firm* — Foley & Lardner LLP

(57) ABSTRACT

An object of the present invention is to improve assemblability of a power semiconductor device. A power semiconductor device includes a plurality of submodules that includes a semiconductor element interposed between a source conductor and a drain conductor, a sense wiring that transmits a sense signal of the semiconductor element, and an insulating portion at which the sense wiring and the sense conductor are arranged, and a source outer conductor that is formed to surround the source conductor and is joined to the source conductor in each of the plurality of submodules. Each source conductor included in the plurality of submodules includes protrusion portions that are formed toward the sensor wiring from the source conductor, are connected to the sense wiring, and define a distance between the sense wiring and the source outer conductor.

5 Claims, 11 Drawing Sheets

(51) Int. Cl.
*H01L 23/00* (2006.01)
*H01L 25/07* (2006.01)
*H01L 25/18* (2006.01)

(52) U.S. Cl.
CPC .............. *H01L 24/32* (2013.01); *H01L 24/40* (2013.01); *H01L 25/07* (2013.01); *H01L 25/18* (2013.01); *H01L 2224/32221* (2013.01); *H01L 2224/40139* (2013.01)

(56) References Cited

U.S. PATENT DOCUMENTS

| | | | |
|---|---|---|---|
| 2006/0044772 A1* | 3/2006 | Miura | H01L 25/072 361/767 |
| 2007/0012947 A1* | 1/2007 | Larking | H01L 24/40 257/150 |
| 2008/0054439 A1* | 3/2008 | Malhan | H01L 25/18 257/690 |
| 2008/0246127 A1* | 10/2008 | Larking | H01L 23/3114 257/664 |
| 2012/0235162 A1* | 9/2012 | Isobe | H01L 23/473 257/77 |
| 2013/0015496 A1 | 1/2013 | Konno | |
| 2013/0175678 A1* | 7/2013 | Ide | H01L 23/4334 257/675 |
| 2013/0207121 A1* | 8/2013 | Kawanami | H01L 24/33 257/76 |
| 2017/0092596 A1* | 3/2017 | Yoshihara | H01L 23/49582 |
| 2018/0182745 A1* | 6/2018 | Ikeda | H01L 23/3735 |
| 2018/0226356 A1* | 8/2018 | Ikeda | H01L 23/24 |

\* cited by examiner (a)

(b)

(a)

(b)

POWER SEMICONDUCTOR DEVICE

TECHNICAL FIELD

The present invention relates to a power semiconductor device.

BACKGROUND ART

Power semiconductor elements are widely used for consumer, in-vehicle, railway, and substation facilities. In power semiconductor devices, expansion of usage and cost reduction, for example, improved assemblability are required. PTL 1 discloses a power semiconductor module that includes a power semiconductor element which has a first electrode surface on which a gate electrode and an emitter electrode are formed and a second electrode surface on which a collector electrode is formed, a first conductive plate that is disposed to face the first electrode surface and is electrically connected to the emitter electrode, a second conductive plate that is disposed to face the second electrode surface and is electrically connected to the collector electrode, a first signal conductor that is electrically connected to the gate electrode and transmits a signal to the gate electrode, and a second signal conductor that is electrically connected to a Kelvin emitter electrode for measuring a reference potential of the signal. A part of the first conductive plate is used as the Kelvin emitter electrode by electrically connecting the first conductive plate with the second signal conductor.

CITATION LIST

Patent Literature

PTL 1: JP 2014-067897 A

SUMMARY OF INVENTION

Technical Problem

In the invention described in PTL 1, there is room for improvement in assemblability of a power semiconductor device.

Solution to Problem

A power semiconductor device according to a first aspect of the present invention includes a plurality of submodules that includes a semiconductor element interposed between a source conductor and a drain conductor, a sense wiring that transmits a sense signal of the semiconductor element, and an insulating portion at which the sense wiring and the sense conductor are arranged, and a source outer conductor that is formed to surround the source conductor and is joined to the source conductor in each of the plurality of submodules. Each source conductor included in the plurality of submodules includes protrusion portions that are formed toward the sensor wiring from the source conductor, are connected to the sense wiring, and define a distance between the sense wiring and the source outer conductor.

Advantageous Effects of Invention

According the present invention, the assemblability of the power semiconductor device can be improved.

DESCRIPTION OF EMBODIMENTS

Embodiment

Hereinafter, an embodiment of a power semiconductor device will be described with reference to FIGS. 1 to 8.

Figure 1:
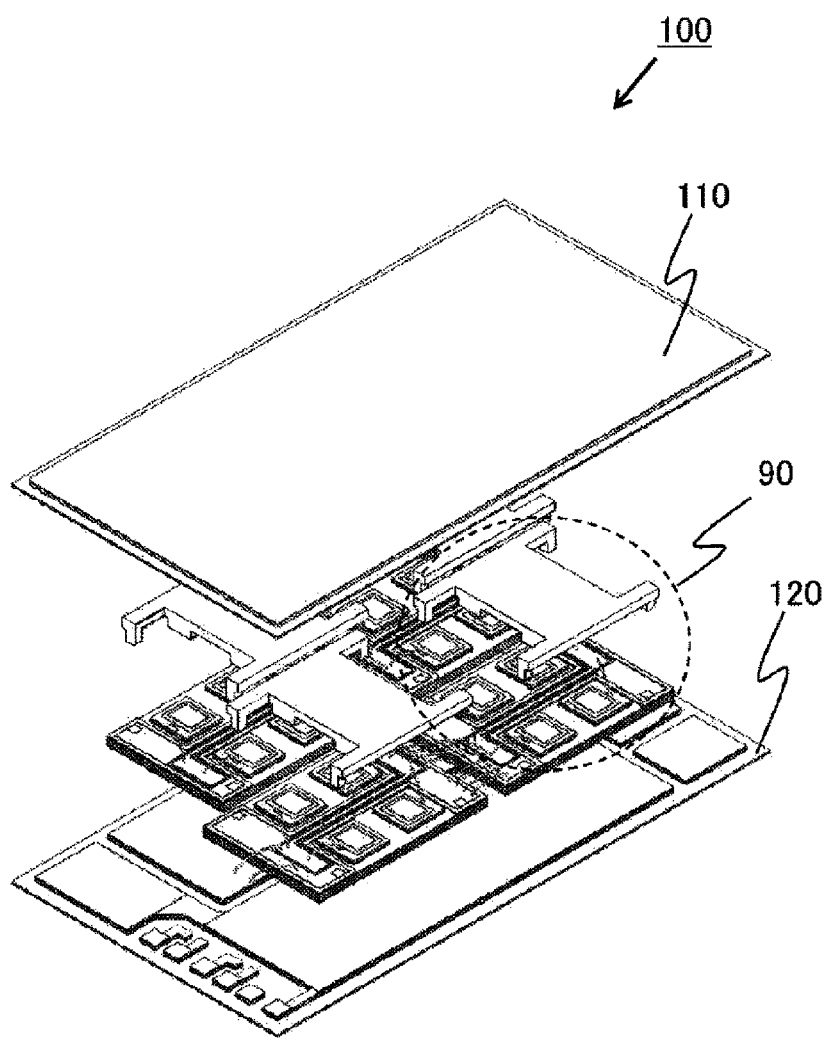
FIG. 1 is an exploded perspective view of a power semiconductor device 100.

FIG. 1 is an exploded perspective view of a power semiconductor device 100 according to the present invention. The power semiconductor device 100 includes four submodules 90, a source outer conductor 110, and a drain outer conductor 120. The four submodules 90 can be classified into two submodules 90 constituting an upper arm circuit and two submodules 90 constituting a lower arm circuit. Here, the configurations of the submodules 90 are the same.

Figure 2:
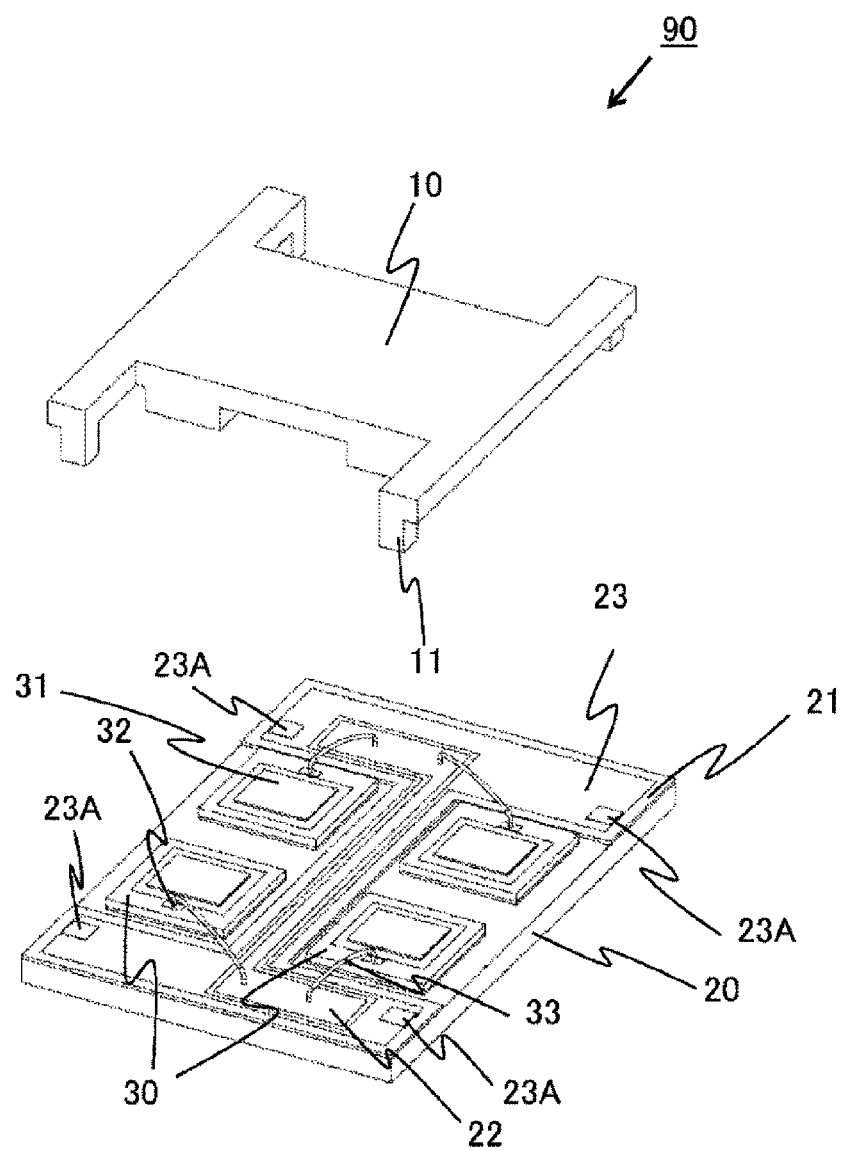
FIG. 2 is an exploded perspective view of a submodule 90.

FIG. 2 is an exploded perspective view of the submodule 90. The submodule 90 includes a source conductor 10 in an upper part of the diagram, a drain conductor 20 in a lower part of the diagram, and four semiconductor elements 30 connected to the drain conductor 20. The four semiconductor elements 30 have the same configuration, and the four semiconductor elements 30 are connected in parallel such that the submodule 90 can cope with a large current. The source conductor 10 includes protrusion portions 11 at four corners. The source conductor 10 is made of metal such as copper or aluminum, and the protrusion portions 11 are formed by pressing or cutting.

The four protrusion portions 11 provided on the source conductor 10 correspond to the four semiconductor elements 30 in a one-to-one correspondence. The protrusion portion 11 ensures a certain thickness for two reasons. The first reason is to ensure strength for defining a distance between the source outer conductor 110 and the drain outer conductor 120. The second reason is to decrease an inductance. Details will be described below.

The drain conductor 20 has an insulating layer 21 on the entire surface, and has a gate wiring 22 and a sense wiring 23 on the insulating layer 21. Here, the insulating layer 21 is not provided on the surface of the drain conductor 20 which is a region in which the semiconductor element 30 is disposed. For example, resin or ceramic can be used for the insulating layer 21. Each of the gate wiring 22 and the sense wiring 23 is further connected to a drive controller (not illustrated) that controls an operation of the semiconductor element 30 via a wiring (not illustrated). "Sense" has various names. For example, "source sense", "Kelvin source", "Kelvin emitter", and "Kelvin sense" are all used in the same meaning as "sense".

The drive controller (not illustrated) applies a voltage to a gate terminal 32 of the semiconductor element 30 via the gate wiring 22 with a connection to a source terminal 31 of the semiconductor element 30 via the sense wiring 23 as ground, that is, a reference potential. Hereinafter, an inductance element in connection with the source terminal 31 of the semiconductor element 30 via the sense wiring 23 is referred to as an "inductance related to a sense signal". Although two reasons why the protrusion portion 11 needs a certain thickness are described, the second reason is accurately reduce the inductance related to the sense signal.

The semiconductor element 30 is, for example, a Si-IGBT or a SiC-MOSFET. The semiconductor element 30 includes the source terminal 31, the gate terminal 32, and a drain terminal (not illustrated). As illustrated in FIG. 2, the source terminal 31 has a large area, and the gate terminal 32 has a small area. The reason why the area of the source terminal 31 is set to be large is mainly for two reasons. The first reason is to cause a large current to easily flow, and the second reason is to reduce the inductance.

In a posture of the semiconductor element 30 illustrated in FIG. 2, the drain terminal of the semiconductor element 30 is present in a lower direction in the diagram, and the drain terminal and the drain conductor 20 are electrically connected. The source terminal 31 is electrically connected to the source conductor 10 by joining the source conductor 10 to the drain conductor 20. Here, a joint portion such as solder may be formed between the source terminal 31 and the source conductor 10, or a metal block may be further provided. The gate terminal 32 of the semiconductor element 30 is connected to the gate wiring 22 by a bonding wire 33.

Four squares included in the region of the sense wiring 23 are contact regions 23A that are in contact with the protrusion portions 11. The contact regions 23A are located at approximately four corners of the drain conductor 20, and are located in a region outside the semiconductor element 30. Details will be described below. The gate wiring 22 has regions to which the bonding wires 33 are connected at the front and rear of the diagram, and these regions are connected at a center in the width direction of FIG. 2. Since the semiconductor element 30 generates a large amount of heat, there is a problem in arranging the semiconductor element 30 so as to be close to the drain conductor 20 from the viewpoint of heat dissipation, and thus, the semiconductor element is arranged so as to be separated from the drain conductor 20. Accordingly, the gate wiring 22 is arranged in this empty space.

Figure 3:
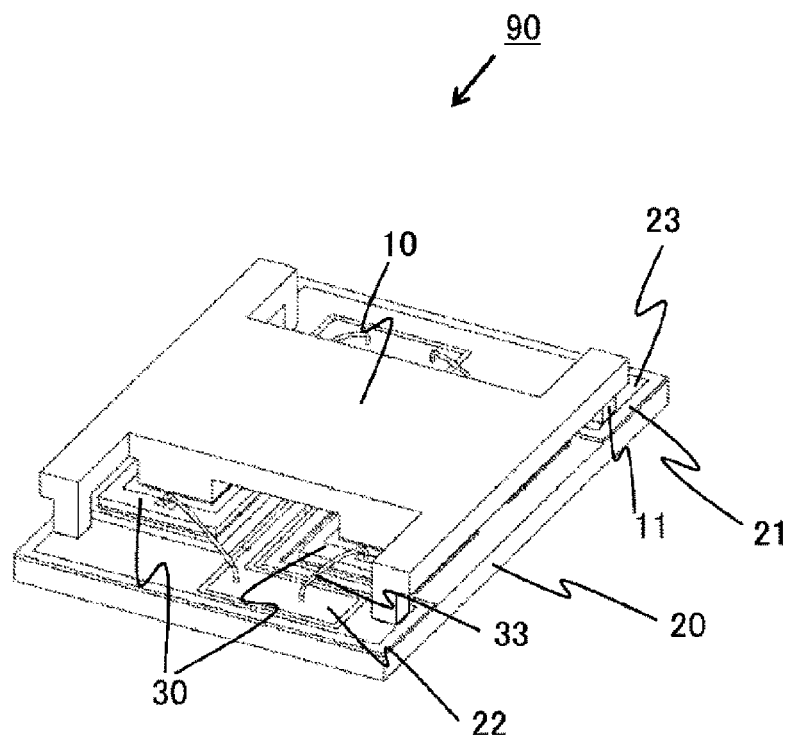
FIG. 3 is a diagram illustrating a state in which a source conductor 10 and a drain conductor 20 are combined.

FIG. 3 is a diagram illustrating a state in which the source conductor 10 and the drain conductor 20 are combined. The source conductor 10 is electrically connected to the source terminal 31 of the semiconductor element 30, and the protrusion portions 11 are electrically connected to the sense wiring 23.

Figure 4:
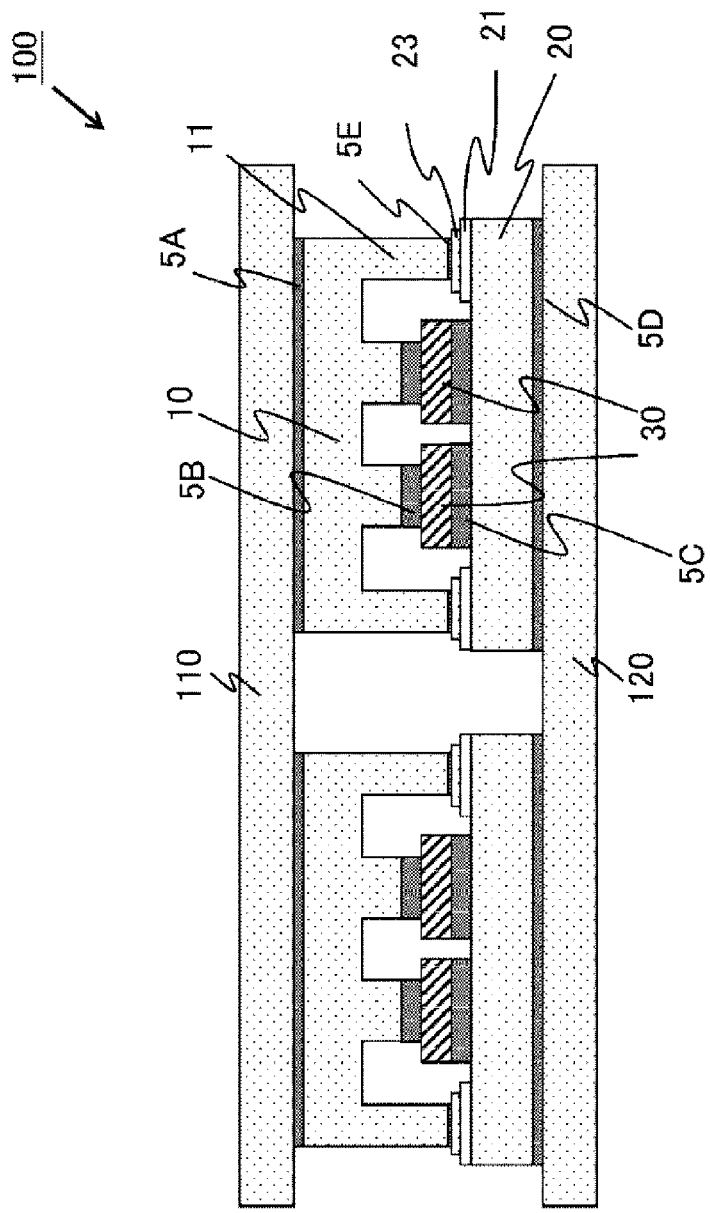
FIG. 4 is a front view of the power semiconductor device 100.

FIG. 4 is a front view of the power semiconductor device 100. Here, FIG. 4 illustrates only two submodules 90. FIG. 4 illustrates joint portions 5A to 5E which are not illustrated in FIGS. 1 to 3. The joint portion is, for example, solder or sintered metal.

The distance between the source outer conductor 110 and the drain outer conductor 120 is defined by a thickness of the drain conductor 20, a thickness of the sense wiring 23, and a length of the protrusion portion 11. That is, heights of the joint portion 5B and the joint portion 5C in contact with the semiconductor element 30 are decided by a difference between the length of the protrusion portion 11 and a thickness of the semiconductor element 30. Thus, a height of the submodule 90 can be managed by managing the length of the protrusion portion 11 and a height of the drain conductor 20 with high accuracy. Adhesion between the submodule 90 and the source outer conductor 110 and adhesion between the submodule 90 and the drain outer conductor 120 can be controlled with high precision by setting heights of all the submodules 90 to be uniform. These adhesions are important for electricity transmission and heat dissipation.

(Influence of Inductance)

Figure 5:
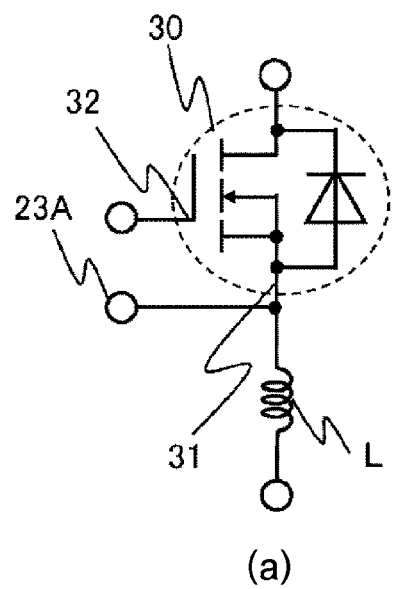
FIG. 5 an equivalent circuit of the submodule 90.
Figure 5:
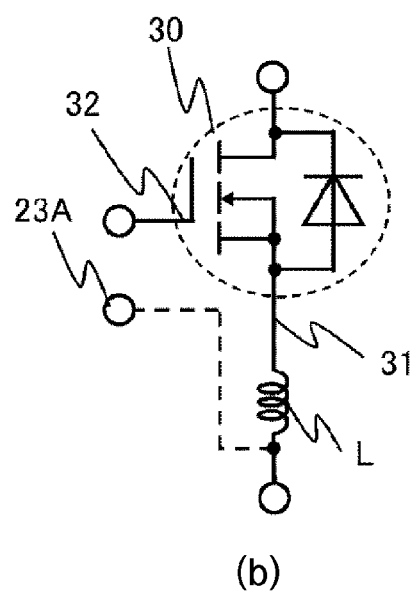

FIG. 5 is an equivalent circuit of the submodule 90. Here, FIG. 5 illustrates only one arm for the sake of simplicity. FIG. 5(a) is a diagram illustrating ideal sense connections as illustrated in FIGS. 1 to 4, and FIG. 5(b) is a diagram illustrating undesirable sense connections. A configuration corresponding to FIG. 5(b) corresponds to, for example, a configuration in which the protrusion portion 11 is replaced with a thin wire, or a configuration in which the protrusion portion 11 is formed near a center of the source conductor 10. L illustrated in FIG. 5 is an inductance present in a flow path of a current. That is, in FIG. 5(a), the inductance related to the sense signal has a small value that can be negligible, and in FIG. 5(b), the inductance related to the sense signal has a value that cannot be ignored.

When a large current starts to flow through the source terminal 31 and when the flowing of the current stops, a potential difference V illustrated in the following Equation 1 generated before and after the inductance L.

$$V = L \, di/dt \qquad (1)$$

Since the sense signal functions as the ground of a gate signal, there is a concern that the semiconductor element 30 may malfunction due to the potential difference in the state illustrated in FIG. 5(b). When the drive controller (not illustrated) outputs the gate signal, a time delay occurs due to the presence of the inductance. When the time delay varies depending on the semiconductor element 30, since a load concentrates on the semiconductor element 30 being operated, a failure occurs. Accordingly, it is desirable that the sense connections illustrated in FIG. 5(a).

(Plan View of Submodule 90)

Figure 6:
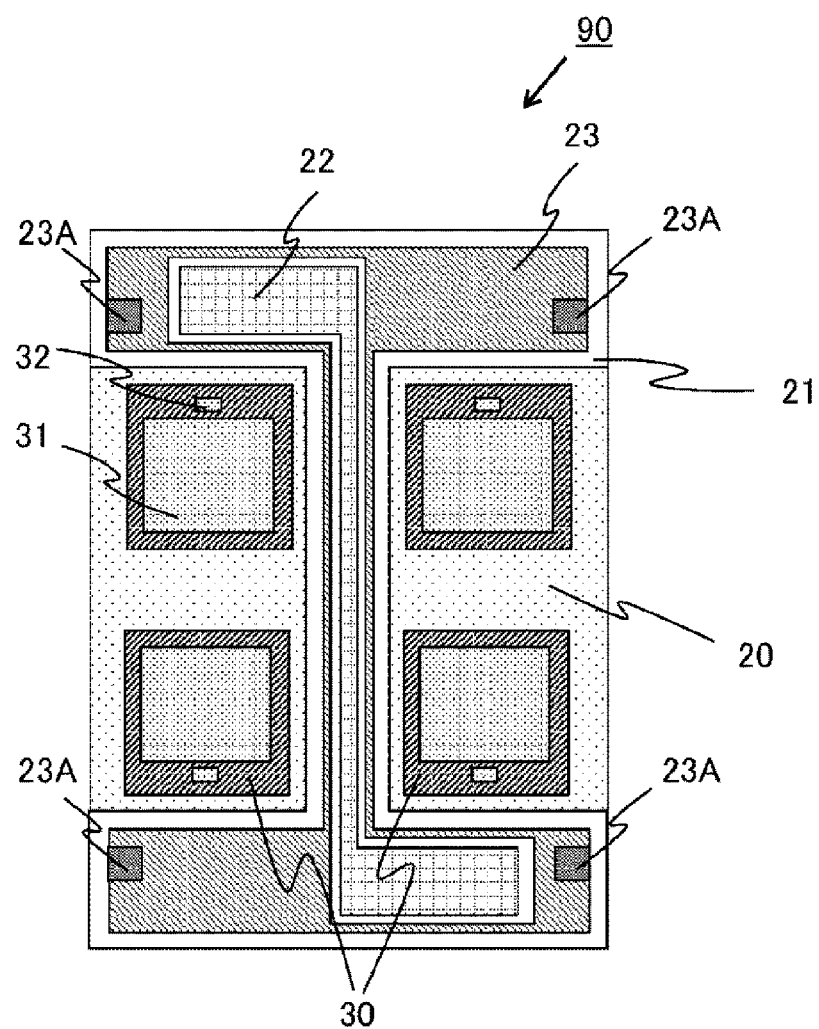
FIG. 6 is a plan view of the submodule 90 with the source conductor 10 is removed.

FIG. 6 is a plan view of the submodule 90 with the source conductor 10 is removed.

In FIG. 6, the drain conductor 20, the insulating layer 21, the gate wiring 22, and the sense wiring 23 are schematically illustrated. The insulating layer 21 is formed between the drain conductor 20 and the sense wiring 23 and between the sense wiring 23 and the gate wiring 22. At a center of FIG. 6, four substantially square semiconductor elements 30 are arranged at predetermined intervals. This is because the semiconductor elements 30 generate a large amount of heat, and when these semiconductor elements are arranged densely, sufficient heat cannot be dissipated.

The sense wiring 23 extends in upper and lower parts of FIG. 6, and regions of the sense wiring 23 in the upper and lower parts of FIG. 6 are connected through the center of FIG. 6, that is, between the semiconductor elements 30.

The gate wiring 22 also has regions in the upper and lower parts of FIG. 6 like the sense wiring 23, and the regions of the gate wiring 22 in the upper and lower parts of FIG. 6 are connected through the center of FIG. 6, that is, between the semiconductor elements 30. As described above, the gate wiring 22 and the sense wiring 23 are arranged by utilizing the regions in the center of FIG. 6 generated by the problem of the heat generation. Next, regions in which the contact regions 23A are present will be described.

Figure 7:
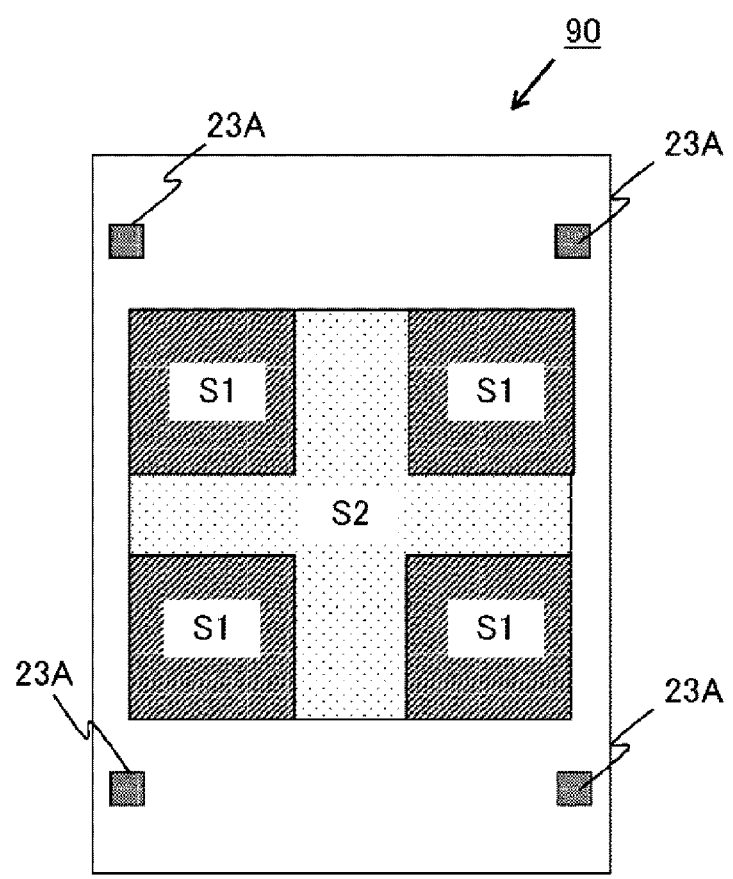
FIG. 7 is a diagram illustrating regions in which contact regions 23A are present.

FIG. 7 is a diagram for describing the regions in which the contact regions 23A are present. FIG. 7 is a plan view of the submodule 90 as in FIG. 6. In FIG. 7, regions in which the semiconductor elements 30 are arranged are defined as first regions S1, and a region between the semiconductor elements 30 is defined as a second region S2. The second region S2 can also be referred to as a region sandwiched between the semiconductor elements 30. The contact regions 23A are formed in regions that do not overlap with the first region S1 and the second region S2 and near the first regions S1. As described above, since the contact regions 23A are regions that are in contact with the protrusion portions 11, the protrusion portions 11 are formed at positions that do not overlap with the first regions S1 and the second region S2 when viewed in the plan view illustrated in FIG. 7, that is, when viewed from the arrangement direction of the source conductor 10 and the drain conductor 20.

According to the aforementioned embodiment, t following advantageous effects are obtained.

(1) The power semiconductor device 100 includes the four submodules 90 and the source outer conductor 110. The submodule 90 includes the semiconductor element 30 sandwiched between the source conductor 10 and the drain conductor 20, the sense wiring 23 that transmits the sense signal of the semiconductor element 30, and the insulating layer 21 on which the sense wiring 23 and the source conductor 10 are arranged. The source outer conductor 110 is formed so as to surround the source conductors 10 of the plurality of submodules 90 and is joined to the source conductors 10. Each source conductor includes the protrusion portions 11 which are formed from the source conductor 10 toward the sense wiring 23, are connected to the sense wiring 23, and define the distance between the sense wiring 23 and the source outer conductor 110. Thus, the inductance related to the sense signal can be reduced by the protrusion portions 11, and the heights of the submodules 90 are uniform by defining the height direction of the protrusion portions 11. Accordingly, the adhesion between the source conductor and the source outer conductor 110 can be improved. That is, assemblability of the power semiconductor device 100 can be improved.

Figure 8:
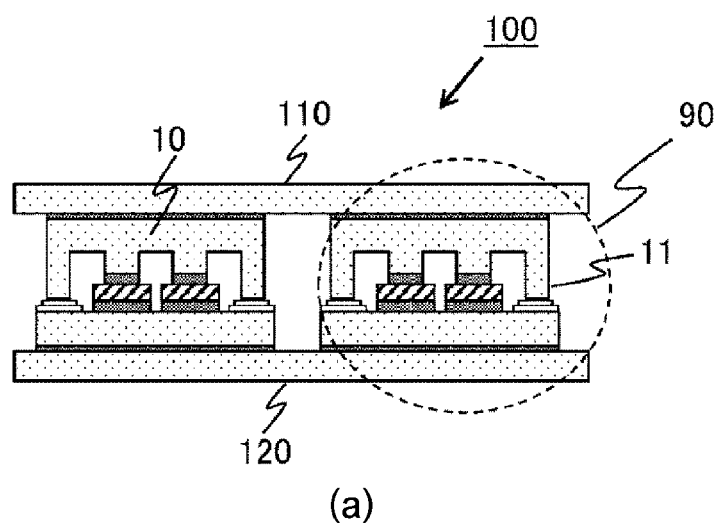
FIG. 8 is a diagram illustrating a comparison between the power semiconductor device 100 according to the present embodiment and a power semiconductor device 100Z according to a comparative example.
Figure 8:
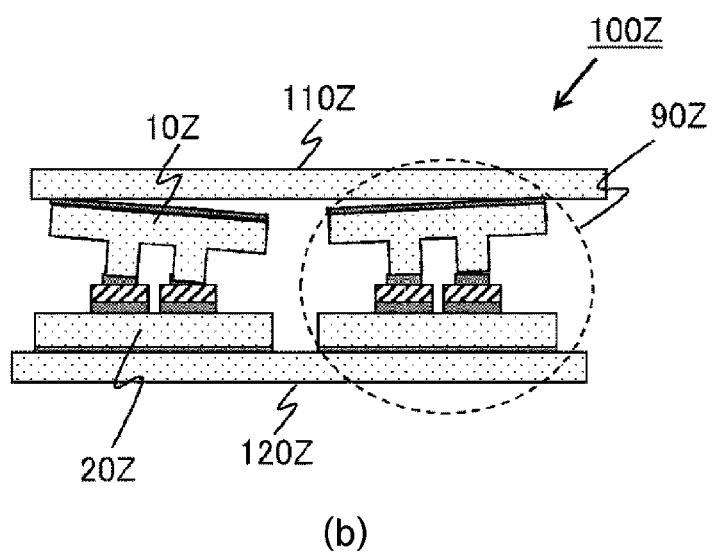

Since the inductance has already been described, the adhesion between the source conductor 10 and the source outer conductor 110 will be described here. FIG. 8 is a diagram illustrating comparison between the power semiconductor device 100 according to the present embodiment and a power semiconductor device 100Z according to a comparative example. The power semiconductor device 100 illustrated in FIG. 8(a) is the same as that of FIG. 4. The power semiconductor device 100Z illustrated in FIG. 8(b) includes a plurality of submodules 90Z, and each submodule 90Z includes a source conductor 10Z. Since the source conductor 10Z according to the comparative example does not include the protrusion portions 11, it is difficult to set the distance between the source conductor 10Z and a drain conductor 20Z to a specified value, and the source conductor tends to be oblique as illustrated in FIG. 8 (b). Thus, it is difficult to bring a source outer conductor 110Z into close contact with the submodule 90Z.

More specifically, when the power semiconductor device 100Z includes only one submodule 90Z, the source outer conductor 110Z and the submodule 90Z can be brought into close contact with each other. However, since the power semiconductor device 1002 includes the plurality of submodules 90Z, unless the heights of all the submodules 90Z are uniform and horizontal, the source outer conductor 110Z and the submodule 90Z cannot be brought into close contact with each other. As described above, as compared with the comparative example not including the protrusion portions 11 while referring to FIG. 8, since the power semiconductor device 100 according to the present embodiment includes the protrusion portions 11, the adhesion between the source conductor 10 and the source outer conductor 110 can be improved.

(2) Each of the plurality of submodules 90 includes the plurality of semiconductor elements 30 including the semiconductor element 30. When viewed from the arrangement direction of the source conductor 10 and the drain conductor 20, the protrusion portions 11 are formed at the positions that do not overlap with the first regions S1 in which the plurality of semiconductor elements 30 is arranged and the second region S2 between the plurality of semiconductor elements 30. Accordingly, the inductance related to the sense signal can be reduced, and malfunction and damage to the semiconductor element 30 can be prevented.

(3) Each of the plurality of submodules 90 includes the plurality of semiconductor elements 30 including the semiconductor element 30. The number of the protrusion portions 11 is the same as the number of the plurality of semiconductor elements 30. Thus, for each of the semiconductor elements 30 included in the submodule 90, the inductance relating to the sense signal can be reduced, and the malfunction and damage of the semiconductor element 30 can be prevented. As described above, it is desirable that the contact regions 23A are outside the first regions S1 and the second region S2 and are near the semiconductor elements 30. Accordingly, when the number of the protrusion portions 11 is smaller than the number of semiconductor element 30, all the conditions cannot be simultaneously satisfied. However, when the same number of protrusion portions 11 as the number of semiconductor elements 30 are formed as in the present embodiment, the protrusion portions 11 can be formed at appropriate positions for each semiconductor element 30.

(4) When viewed from the arrangement direction of the source conductor 10 and the drain conductor 20, the sense wiring 23 is formed so as to be formed between the plurality of semiconductor elements 30. Accordingly, the power semiconductor device 100 can be miniaturized by effectively utilizing a gap between the semiconductor elements 30 arranged at intervals for efficient heat dissipation.

Modification Example 1

In the aforementioned embodiment, the submodule 90 includes the four semiconductor elements 30. However, the number of the semiconductor elements 30 provided in the submodule 90 is not limited to four, and may be one or more.

Figure 9:
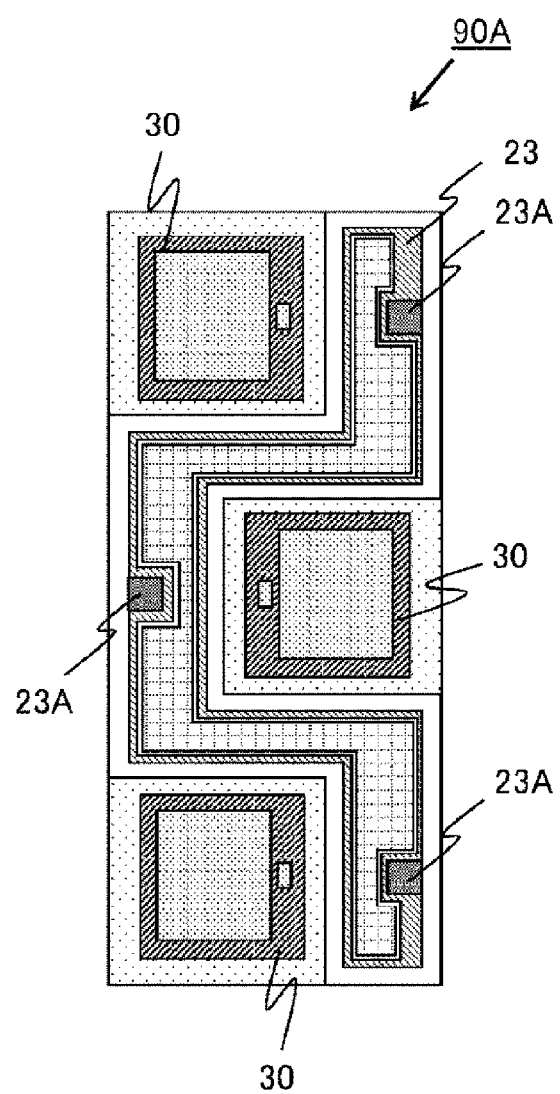
FIG. 9 is a plan view of a submodule 90A according to Modification Example 1.

FIG. 9 is a plan view of a submodule 90A including three semiconductor elements 30 according to Modification Example 1. Here, the source conductor 10 is not illustrated in FIG. 9. The submodule 90A includes contact regions 23A corresponding to the three semiconductor elements 30, and the sense wiring 23 connecting the contact regions 23A is formed between the semiconductor elements 30 as in the aforementioned embodiment. In FIG. 9, the protrusion portions 11 are also formed at positions that do not overlap with regions in which the plurality of semiconductor elements 30 is arranged and a region between the semiconductor elements 30.

Modification Example 2

In the aforementioned embodiment, the number of protrusion portions 11 provided in each submodule 90 is the same as the number of semiconductor elements 30. However, the number of protrusion portions 11 provided in each submodule 90 may be larger or smaller than the number of semiconductor elements 30. At least two protrusion portions 11 may be provided in each submodule 90.

Figure 10:
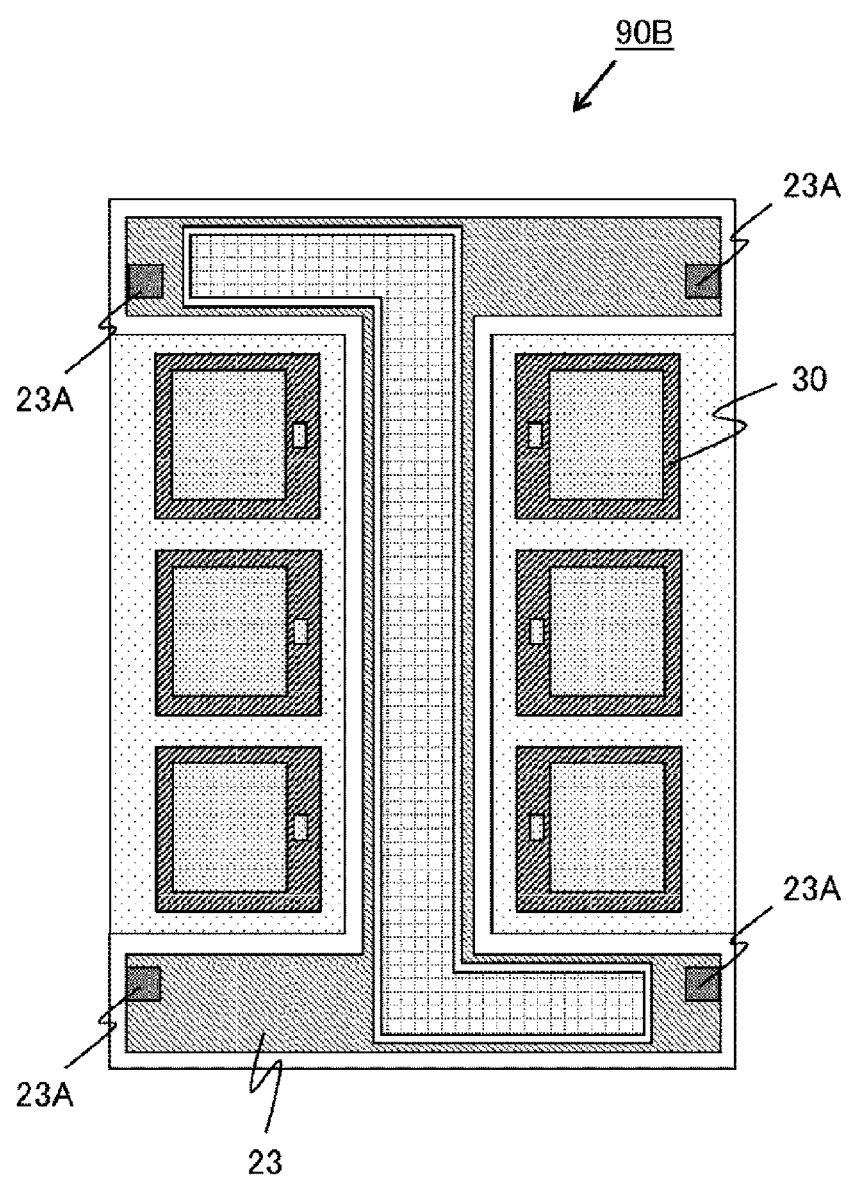
FIG. 10 is a plan view of a submodule 90B according to Modification Example 2.

FIG. 10 is a plan view of a submodule 90B according to Modification Example 2. Here, the source conductor 10 is not illustrated in FIG. 10. The submodule 90B includes six semiconductor elements 30, four protrusion portions 11, and four contact regions 23A. In FIG. 10, the protrusion portions 11 are formed at positions that do not overlap regions where the plurality of semiconductor elements 30 is arranged and a region between the semiconductor elements 30.

Modification Example 3

In the aforementioned embodiment, the source conductor 10 is formed integrally with the protrusion portions 11 by pressing or cutting. However, the protrusion portions 11 may be formed by using a member different from the source conductor, and may be connected by metal joint portions.

Figure 11:
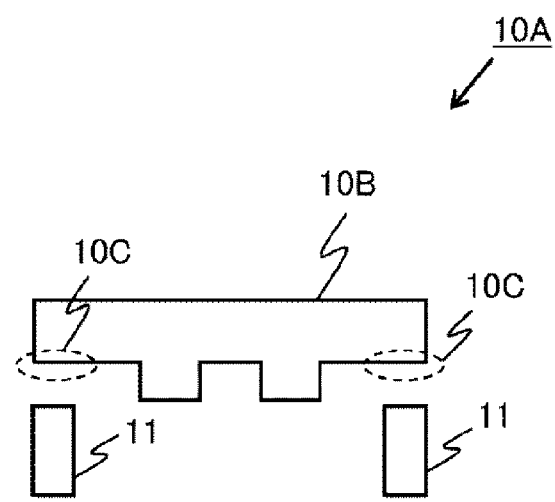
FIG. 11 is a view illustrating a source conductor 10A according to Modification Example 3.

FIG. 11 is a diagram illustrating a source conductor 10A according to Modification Example 3. In Modification Example 3, the protrusion portions 11 are made of copper, and a source conductor 10B excluding the protrusion portions 11 is made of aluminum. The source conductor 10B excluding the protrusion portions 11 is processed into a shape illustrated in FIG. 11 by pressing. The protrusion portions 11 are processed into a shape illustrated in FIG. by, for example, cutting. The source conductor 10B excluding the protrusion portions 11 becomes the source conductor 10A by forming metal joint portions 100 connected to the protrusion portions 11.

The metal joint portions 100 can be formed by various methods, and can be formed by, for example, a pressure welding method of applying a pressure to heated metals to join the metals, or a fusion welding method of melting and joining contact portions between metals by heat.

According to Modification Example 3, the following advantageous effects are obtained.

(5) The protrusion portions 11 are formed by using a member different from the source conductor 10B excluding the protrusion portions 11, and are connected to the source conductor 10B by the metal joint portions 100. Accordingly, a material of the protrusion portion 11 can be different from other portions of the source conductor 10A, and a degree of freedom in design can be improved.

The aforementioned embodiment and modification examples may be combined with each other. Although various embodiments and modification examples have been described above, the present invention is not limited to these contents. Other aspects considered within the scope of the technical idea of the present invention are also included within the scope of the present invention.

REFERENCE SIGNS LIST 10, 10A source conductor
10C metal joint portion
11 protrusion portion
20 drain conductor
21 insulating layer
22 gate wiring
23 sense wiring
30 semiconductor element
31 source terminal
32 gate terminal
90, 90A, 90B submodule
100 power semiconductor device
110 source outer conductor
120 drain outer conductor
L inductance
S1 first region
S2 second region

The invention claimed is:

1. A power semiconductor device comprising:
  a plurality of submodules that includes a semiconductor element interposed between a source conductor and a drain conductor, a sense wiring that transmits a sense signal of the semiconductor element, and an insulating portion at which the sense wiring and the source conductor are arranged; and
  a source outer conductor that is formed to surround the source conductor and is joined to the source conductor in each of the plurality of submodules,
  wherein each source conductor included in the plurality of submodules includes protrusion portions that are formed toward the sensor wiring from the source conductor, are connected to the sense wiring, and define a distance between the sense wiring and the source outer conductor.

2. The power semiconductor device according to claim 1, wherein the protrusion portions are formed by using a member different from the source conductor, and are connected to the source conductor by metal joint portions.

3. The power semiconductor device according to claim 1, wherein
  each of the plurality of submodules includes a plurality of semiconductor elements including the semiconductor element, and
  the protrusion portions are formed at positions that do not overlap with first regions in which the plurality of semiconductor elements is arranged and a second region between the plurality of semiconductor elements when viewed from an arrangement direction of the source conductor and the drain conductor.

4. The power semiconductor device according to claim 1, wherein
  each of the plurality of submodules includes a plurality of semiconductor elements including the semiconductor element, and
  the protrusion portions are formed such that the number of protrusion portions is the same as the number of semiconductor elements or is larger than the number of semiconductor elements.

5. The power semiconductor device according to claim 4, wherein, when viewed from an arrangement direction of the source conductor and the drain conductor, the sense wiring is formed so as to be formed between the plurality of semiconductor elements.

* * * * *